United States Patent
Liu et al.

(10) Patent No.: US 7,411,853 B2
(45) Date of Patent: Aug. 12, 2008

(54) VOLATILE MEMORY ELEMENTS WITH ELEVATED POWER SUPPLY LEVELS FOR PROGRAMMABLE LOGIC DEVICE INTEGRATED CIRCUITS

(75) Inventors: Lin-Shih Liu, Fremont, CA (US); Mark T. Chan, San Jose, CA (US); Toan D. Do, San Jose, CA (US)

(73) Assignee: Altera Corporation, San Jose, CA (US)

( * ) Notice: Subject to any disclaimer, the term of this patent is extended or adjusted under 35 U.S.C. 154(b) by 288 days.

(21) Appl. No.: 11/282,437

(22) Filed: Nov. 17, 2005

(65) Prior Publication Data

US 2007/0109017 A1    May 17, 2007

(51) Int. Cl.
  *G11C 5/14* (2006.01)
(52) U.S. Cl. .................. 365/226; 326/40; 365/154; 365/185.11
(58) Field of Classification Search ............. 326/37–41; 365/189.08, 189.11, 226, 154, 156
  See application file for complete search history.

(56) References Cited

U.S. PATENT DOCUMENTS

| | | | |
|---|---|---|---|
| 5,025,417 A | | 6/1991 | Miyamoto et al. |
| 5,122,846 A | | 6/1992 | Haken |
| 5,214,327 A | * | 5/1993 | Saeki et al. .................. 326/38 |
| 5,432,467 A | | 7/1995 | Reddy |
| 5,642,315 A | | 6/1997 | Yamaguchi |
| 5,757,702 A | * | 5/1998 | Iwata et al. ............ 365/189.05 |
| 5,801,551 A | | 9/1998 | Lin |
| 5,920,201 A | | 7/1999 | Mehrotra et al. |
| 6,025,737 A | | 2/2000 | Patel et al. |
| 6,114,843 A | | 9/2000 | Olah |
| 6,232,893 B1 | | 5/2001 | Cliff et al. |
| 6,433,585 B1 | | 8/2002 | Patel et al. |
| 6,724,222 B2 | | 4/2004 | Patel et al. |
| 6,795,332 B2 | | 9/2004 | Yamaoka et al. |
| 6,897,679 B2 | | 5/2005 | Cliff et al. |
| 6,995,584 B1 | | 2/2006 | Nguyen et al. |
| 7,277,351 B2 | * | 10/2007 | Liu et al. .................. 365/226 |
| 2004/0093529 A1 | | 5/2004 | Devlin et al. |
| 2007/0109017 A1 | | 5/2007 | Liu et al. |
| 2007/0113106 A1 | | 5/2007 | Liu et al. |

* cited by examiner

*Primary Examiner*—J. H. Hur
*Assistant Examiner*—Alexander Sofocleous
(74) *Attorney, Agent, or Firm*—Treyz Law Group; G. Victor Treyz

(57) ABSTRACT

Integrated circuits are provided that have volatile memory elements. The memory elements produce output signals. The integrated circuits may be programmable logic device integrated circuits containing programmable core logic including transistors with gates. The core logic is powered using a core logic power supply level defined by a core logic positive power supply voltage and a core logic ground voltage. When loaded with configuration data, the memory elements produce output signals that are applied to the gates of the transistors in the core logic to customize the programmable logic device. The memory elements are powered with a memory element power supply level defined by a memory element positive power supply voltage and a memory element ground power supply voltage. The memory element power supply level is elevated with respect to the core logic power supply level.

15 Claims, 8 Drawing Sheets

VOLATILE MEMORY ELEMENTS WITH ELEVATED POWER SUPPLY LEVELS FOR PROGRAMMABLE LOGIC DEVICE INTEGRATED CIRCUITS

BACKGROUND

This invention relates to volatile memory elements, and more particularly, to volatile memory elements that operate at elevated power supply levels on integrated circuits such as programmable logic device integrated circuits.

Integrated circuits often contain volatile memory elements. Typical volatile memory elements are based on cross-coupled inverters (latches) and are used to store data. Each memory element can store a single bit of data.

Volatile memory elements are often used to store configuration data in programmable logic devices. Programmable logic devices are a type of integrated circuit that can be customized in relatively small batches to implement a desired logic design. In a typical scenario, a programmable logic device manufacturer designs and manufactures uncustomized programmable logic device integrated circuits in advance. Later, a logic designer uses a logic design system to design a custom logic circuit. The logic design system uses information on the hardware capabilities of the manufacturer's programmable logic devices to help the designer implement the logic circuit from the resources available on a given programmable logic device.

The logic design system creates configuration data based on the logic designer's custom design. When the configuration data is loaded into the memory elements of one of the programmable logic devices, it programs the logic of that programmable logic device so that the programmable logic device implements the designer's logic circuit. The use of programmable logic devices can drastically reduce the amount of effort required to implement a desired integrated circuit design.

Conventional programmable logic device memory elements are powered using a positive power supply voltage and a ground. The positive power supply voltage that is used to power conventional programmable logic device memory elements is typically referred to as Vcc or Vcc-core and is the same power supply voltage used to power the core logic in the programmable logic device. The ground voltage that is used to power conventional, programmable logic device memory elements is referred to as Vss and is the same ground power supply voltage that is using in powering the core logic.

Integrated circuits such as programmable logic device integrated circuits that operate at low values of Vcc offer benefits over integrated circuits that operate at higher values of Vcc. For example, reductions in Vcc generally lead to reduced power consumption. Because of these benefits, the semiconductor industry is continually striving to produce processes and circuit designs that support reductions in Vcc. Previous generations of programmable logic devices operated at Vcc levels of 2.0 volts, 1.8 volts, and 1.5 volts. More recently, Vcc levels of 1.2 volts have been used in programmable logic devices. It is expected that future programmable logic devices will support Vcc levels of less than 1.2 volts (e.g., 1.1 volts or 1.0 volts).

The memory elements in a programmable logic device produce static output signals that reflect the configuration data that has been loaded into the memory elements. The static output signals drive the gates of metal-oxide-semiconductor (MOS) transistors. Some of the transistors are n-channel metal-oxide-semiconductor (NMOS) transistors that are used as pass transistors in multiplexers and other logic components. Other transistors are p-channel metal-oxide-semiconductor (PMOS) transistors that are used as power-down transistors that selectively turn off unused blocks of circuitry.

The NMOS pass transistors in a programmable logic device will only operate properly if they are driven at a large enough voltage. If the pass transistors in a programmable logic device are driven at an insufficient voltage level because, for example, the Vcc level on the device is too low, the data signals passing through the pass transistors will suffer excessive voltage loss and may no longer be recognizable as valid logic signals on the device.

The PMOS power-down transistors will only operate satisfactorily if they can be turned off completely. If a PMOS transistor is turned of insufficiently, undesirable leakage currents will be produced.

It would therefore be desirable to be able to provide programmable logic device integrated circuits whose NMOS pass transistors and PMOS power down transistors perform satisfactorily, particularly in operating environments with low core logic power supply voltages.

SUMMARY

In accordance with the present invention, integrated circuits such as programmable logic device integrated circuits are provided that contain core logic and memory elements. In programmable logic device integrated circuits, the core logic contains programmable logic that is customized by application of control signals produced at the outputs of the memory elements. The programmable logic is programmed by loading appropriate configuration data into the memory elements. When loaded, the memory elements produce static output signals corresponding to the loaded configuration data. The static output signals are applied to the gates of transistors in the programmable logic to turn the transistors on and off as appropriate.

Core logic transistor performance is improved by using a power supply level to power the memory elements that is larger than the power supply level used to power the core logic. Using an elevated power supply level arrangement of this type more fully turns on transistors to reduce signal degradation and more fully turns off transistors to reduce leakage currents.

The memory elements are cleared using a clear line. The memory elements are loaded with configuration data using data lines. Address lines and address transistors are used to control which memory elements are loaded. Clear, address, and data signals are used that match the memory element power supply voltages.

Further features of the invention, its nature and various advantages will be more apparent from the accompanying drawings and the following detailed description of the preferred embodiments.

DETAILED DESCRIPTION

The present invention relates to integrated circuits containing memory elements. The integrated circuits may be memory chips, digital signal processing circuits with memory arrays, microprocessors, application specific integrated circuits with memory arrays, programmable logic device integrated circuits in which memory elements are used for configuration memory, or any other suitable integrated circuit. For clarity, the present invention will generally be described in the context of programmable logic device integrated circuits and programmable logic device memory elements.

Figure 1:
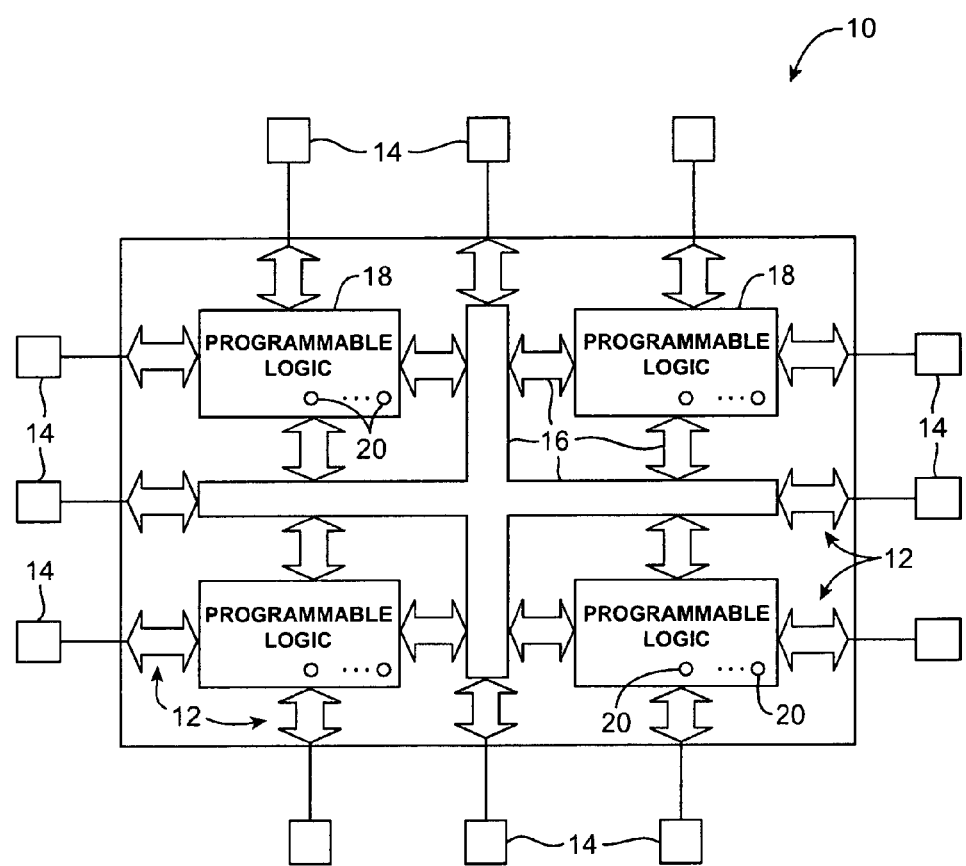
FIG. 1 is a diagram of an illustrative programmable logic device integrated circuit in accordance with the present invention.

An illustrative programmable logic device 10 in accordance with the present invention is shown in FIG. 1. Programmable logic device 10 may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. The memory element output signals are typically applied to the gates of metal-oxide-semiconductor (MOS) transistors. These transistors may include n-channel metal-oxide-semiconductor (NMOS) pass transistors in programmable components such as multiplexers. Some of the output signals may be used to control p-channel metal-oxide-semiconductor (PMOS) power-down transistors.

When a memory element supplies a high output to a NMOS pass transistor, the transistor is turned on and passes logic signals from its input to its output. When the memory element output is low, the pass transistor is turned off and does not pass logic signals. Being able to configure pass transistors in this way allows the logic of the programmable logic device to be programmed to implement a desired logic design.

When a memory element supplies a low output to a PMOS power-down transistor, the transistor is turned on. This allows a block of associated logic circuitry to receive power. When the memory element supplies a high output to the PMOS power-down transistor, the transistor is turned off. This powers down the block of circuitry.

A typical memory element 20 is formed from a number of transistors configured to form cross-coupled inverters. With one suitable approach, complementary metal-oxide-semiconductor (CMOS) integrated circuit technology is used to form the memory elements 20, so CMOS-based memory element implementations are described herein as an example. In the context of programmable logic device integrated circuits, the memory elements store configuration data and are therefore sometimes referred to as configuration random-access memory (CRAM) cells.

The memory elements may be loaded from an external source such as a configuration device integrated circuit via pins 14 and input/output circuitry 12. The loaded memory elements 20 provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may parts of multiplexers, look-up tables, logic arrays, AND, OR, NAND, and NOR logic gates, etc. The memory elements 20 are generally arranged in an array pattern. In a typical modern programmable logic device, there may be millions of memory elements 20 on each chip.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
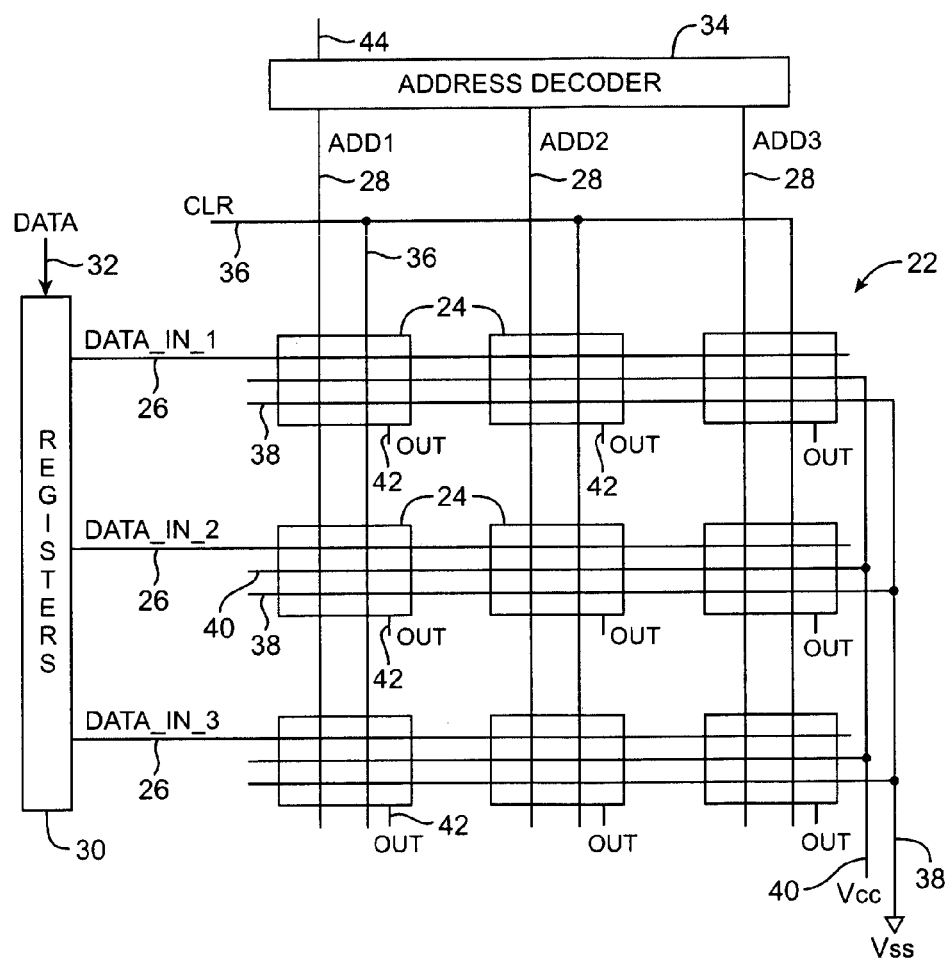
FIG. 2 is a diagram of a conventional array of programmable logic device memory elements.

When memory elements are arranged in an array, horizontal and vertical conductors and associated loading circuitry may be used to load the memory elements with configuration data. A conventional data loading arrangement is shown in FIG. 2. The arrangement of FIG. 2, has a 3×3 array 22 of memory elements 24. (Actual memory arrays typically have hundreds or thousands of rows and columns, but a 3×3 array is used as an example.) The array 22 receives power via positive power supply line 40 and ground line 38 (at 0 volts). The voltage Vcc on line 40 is typically 1.2 volts and the voltage Vss on ground line 38 is typically 0 volts. These are the same voltage levels that are used to power the programmable logic in the core of the programmable logic device in which the array 22 is being used. Accordingly, the voltages Vcc and Vss are sometimes referred to as Vcc-core and Vss-core.

A clear line 36 (labeled CLR) is used to clear the contents of the memory array 22. After the array has been cleared, configuration data may be loaded.

Configuration data is provided in series to registers 30 via input 32. The configuration data is then provided in parallel to array 22 via the DATA_IN_1, DATA_IN_2, and DATA_IN_3 lines 26. Address decoder 34 receives addressing information via input 44. In response, the address decoder asserts a desired one of the address lines 28 (i.e., ADD1, ADD2, or ADD3). When an address line is asserted in a given column, the data on the data lines 26 is loaded into the memory elements 24 in that column. The array is filled by systematically loading the memory elements in each of the columns of the array. After the array has been completely loaded with configuration data, the output 42 of each memory element 24 produces a corresponding static control signal for controlling the gate of a transistor.

Figure 3:
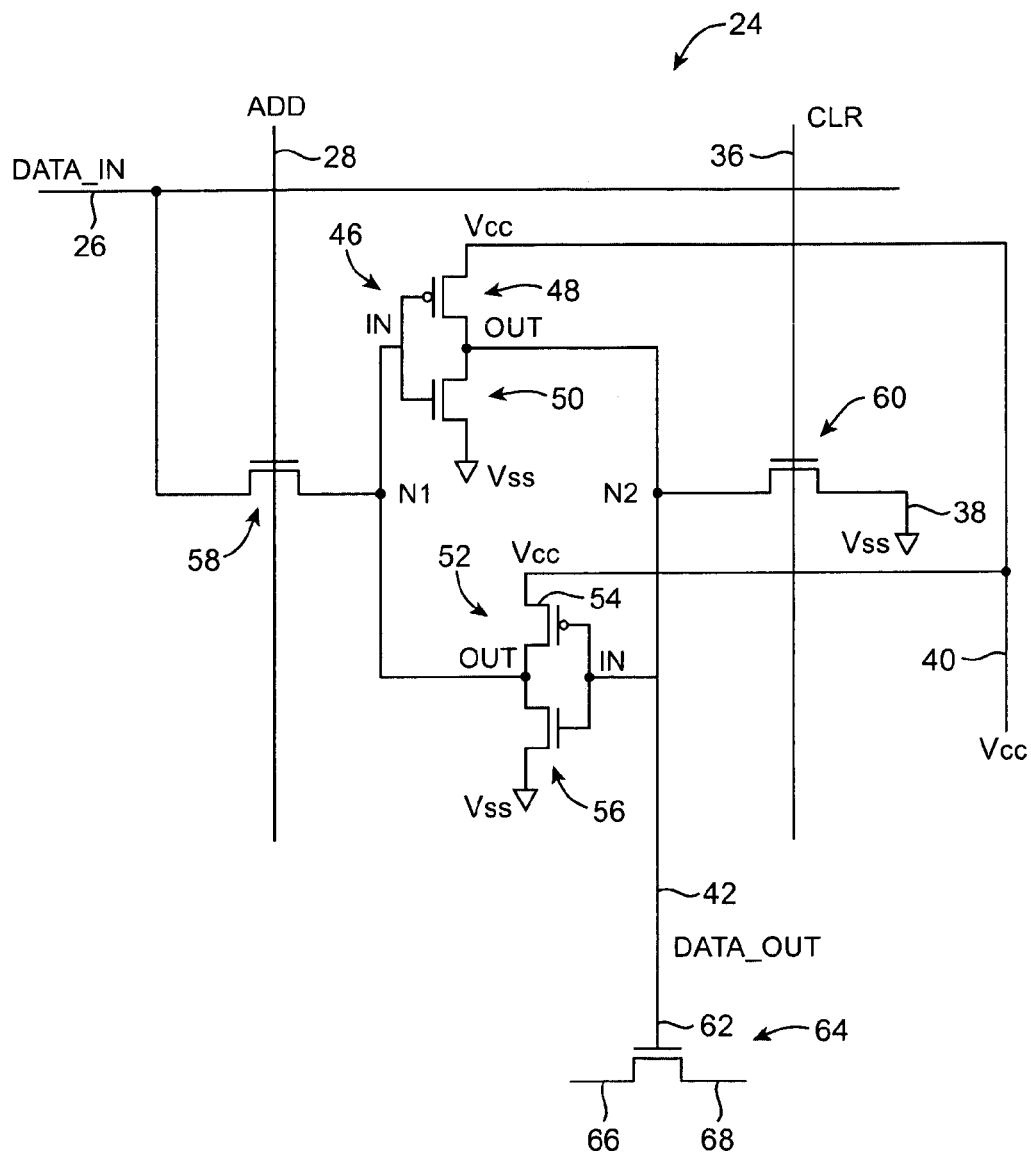
FIG. 3 is a diagram of a conventional programmable logic device memory element.

A conventional memory element 24 of the type used in array 22 of FIG. 2 is shown in FIG. 3. As shown in FIG. 3, the memory element 24 is formed from two cross-coupled inverters—inverter 46 and inverter 52. Inverter 46 has a p-channel metal-oxide-semiconductor (PMOS) transistor 48 and an n-channel metal-oxide-semiconductor (NMOS) transistor 50. Inverter 52 has PMOS transistor 54 and NMOS transistor 56. The NMOS transistor 60 is turned on during clear operations by activating clear line 36. This connects node N2 to ground 38 and clears the memory element 24. The output of the memory element on line 42 (DATA_OUT) is determined by the signal on node N2.

When address line 28 is taken high, NMOS transistor 58 is turned on and the signal on data line 26 is driven into the memory element 24. If the signal on line 26 is high, node N1 remains high and the memory element 24 remains in its low (cleared) state. The output DATA_OUT is low. If the signal on line 26 is low, node N1 is taken low and, due to the inversion of the low N1 signal by inverter 46, the voltage on node N2 is taken high. This makes the output DATA_OUT high.

In the configuration shown in FIG. 3, the DATA_OUT signal is applied to the gate 62 of a pass transistor 64. When DATA_OUT is low, pass transistor 64 is off. When DATA_OUT is high, pass transistor 64 is on and data is allowed to flow between line 66 and line 68. Other memory elements on the device may be used to produce control signals for PMOS power-down transistors, rather than NMOS pass transistors such as transistor 64.

The conventional memory element of FIG. 3 is powered using a positive power supply voltage Vcc and a ground power supply voltage Vss. The logic signals DATA_IN, ADD, CLR, and DATA_OUT have logic high levels of Vcc and logic low levels of Vss, matching the logic voltage levels used in the core logic of the device.

As the semiconductor industry pushes for low values of Vcc, difficulties arise in using the circuit of FIG. 3. When a logic one is loaded into memory element 24, the DATA_OUT signal that is produced has a voltage of Vcc. At low values of Vcc, this DATA_OUT voltage will be relatively low. As a result, transistor 64 may not be driven with adequate strength. In this type of situation, core logic signals that have voltages ranging between 0 volts (Vss) and 1.2 volts (Vcc) at input 66 might degrade so much that they have voltages ranging from 0 volts and 0.6 volts on output 68. This level of signal degradation would be intolerable, because signals at 0.6 volts would not be recognized as valid logic high signals.

In accordance with the present invention, integrated circuits are provided in which different power supply levels are used to power core logic circuitry and memory elements. The core logic can be powered using a positive power supply voltage Vcc and a ground power supply voltage Vss. The memory elements can be powered using an elevated power supply level produced by raising Vcc and/or lowering Vss. With this type of arrangement, the positive power supply voltage that is applied to the memory elements may be a voltage Vcchg-high that is greater than Vcc. The ground power supply voltage that is applied to the memory elements may be a voltage Vsslg that is less than Vss.

By powering the memory elements with an elevated power supply level relative to the core logic, the memory elements produce output control signals that are better able to control the transistors on the integrated circuit. For example, a memory element that produces a high output signal at Vcchg-high and a low output signal at Vsslg is able to turn on an off transistors more fully than a conventional memory element that produces a high output signal at Vcc and a low output signal at Vss. At the same time, a low value of Vcc may be used to reduce core logic power consumption.

Figure 4:
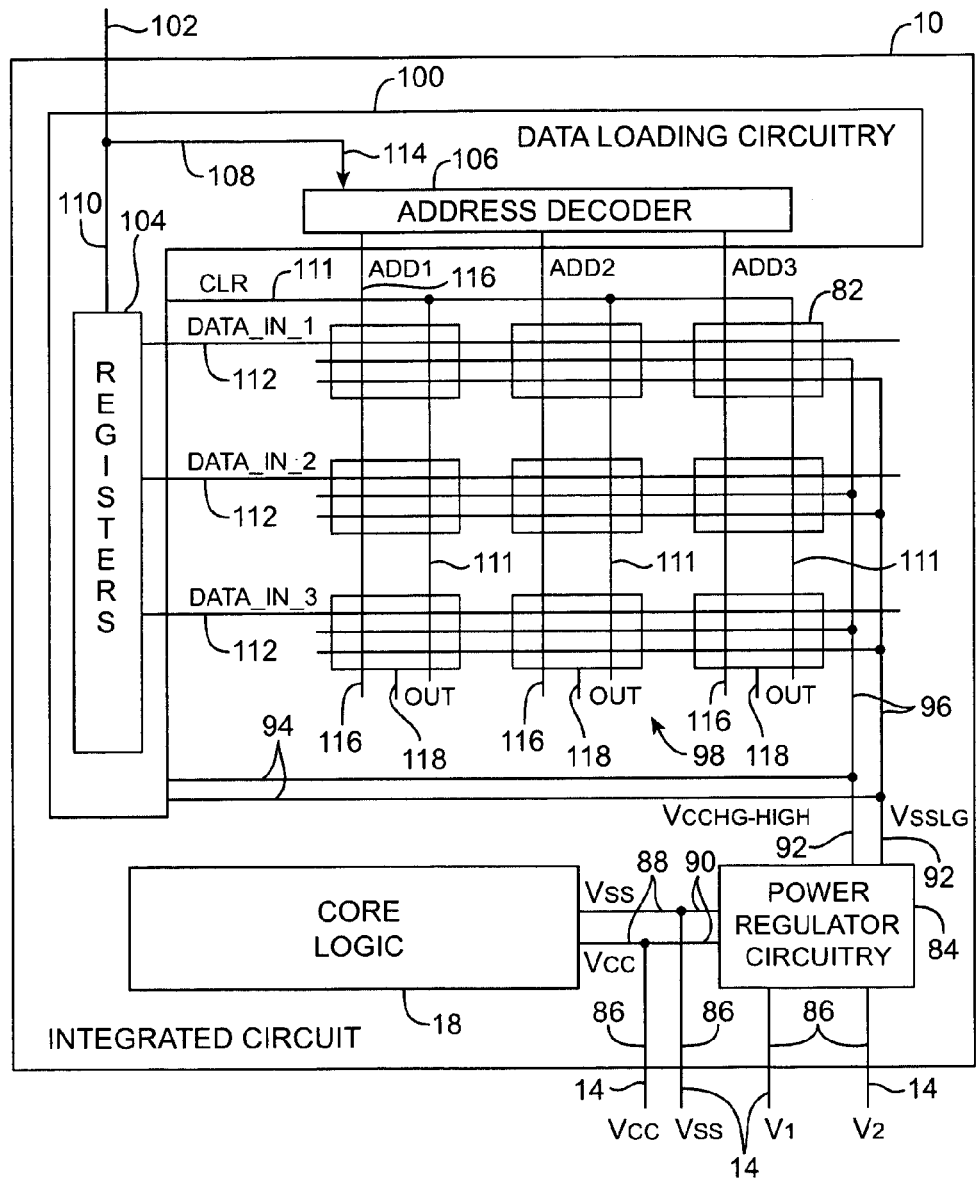
FIG. 4 is a diagram of an illustrative programmable logic device with memory element circuitry in accordance with the present invention.

An illustrative integrated circuit 10 such as a programmable logic device integrated circuit that contains memory elements 82 in accordance with the present invention is shown in FIG. 4. During operation, memory elements 82 of FIG. 4 serve as the programmable elements 20 of FIG. 1.

As shown in FIG. 4, integrated circuit 10 has power regulator circuitry 84. Power regulator circuitry 84 receives power through pins such as pins 14 and paths such as paths 86.

The voltages Vss and Vcc are typically provided to integrated circuit 10 from a board on which integrated circuit 10 is mounted. These power supply voltages are typically distributed to core logic 18 via paths such as paths 88. Paths 90 may be used to provide Vss and Vcc to power regulator circuitry 84.

Power regulator circuitry 84 uses input power signals such as Vss and Vcc from paths 90 to produce power supply voltages Vsslg and Vcchg-high on its outputs 92. Paths 94 convey these power supply voltages to data loading circuitry 100. Paths 96 convey these power supply voltages to the memory elements 82 in array 98.

Any suitable circuitry may be used in power regulator circuitry 84 to produce the power supply voltages Vcchg-high and Vsslg. For example, charge pump circuitry or other voltage boosting circuitry may be used to produce relatively larger voltages from smaller voltages and voltage divider circuitry or other suitable voltage reduction circuitry may be used to produce relatively smaller voltages from larger voltages. If desired, additional power supply voltages may be used as inputs by power regulator circuitry 84. In the example of FIG. 4, power regulator circuitry 84 is shown as receiving two additional power supply voltages $V_1$ and $V_2$. These may be any suitable voltages. For example, $V_1$ may be Vcchg-high and $V_2$ may be Vsslg.

The power supply level for the array 98 is defined by the difference between the positive power supply voltage Vcchg-high and the ground power supply voltage Vsslg. For example, if Vcchg-high is 1.3 volts and Vsslg is −0.2 volts, the power supply level is 1.5 volts. If Vcchg-high is 1.25 volts and Vsslg is −0.3 volts, the power supply level is greater (i.e., 1.55 volts). In general, the power supply level for the memory elements 82 in array 98 is elevated with respect to the power supply level for core logic 18 whenever equation 1 is satisfied.

$$Vcchg\text{-high} - Vsslg > Vcc - Vss \qquad (1)$$

This elevated condition can be obtained by producing a value of Vcchg-high that is larger than Vcc, by producing a value of Vsslg that is less than Vss, or by producing both a value of Vcchg-high that is larger than Vcc and a value of Vsslg that is less than Vss. For clarity, the following discussion sometimes focuses on the particularly suitable arrangement in which both Vcchg-high is greater than Vcc and Vsslg is less than Vss. This is, however, merely one illustrative way in which to produce an elevated power supply level for the memory elements 82.

Any suitable voltage levels may be used for Vcchg-high and Vsslg. For example, if an integrated circuit has core logic circuitry that is operating at a positive power supply voltage Vcc of 1.2 volts and a ground voltage Vss of 0 volts, then power supply voltage levels of 1.4 volts and –0.2 volts might be used for Vcchg-high and Vsslg, respectively. Other voltages could also be used. For example, Vcchg-high might be in the range of 1.2 to 1.7 volts or 1.3 to 1.6 volts, while Vsslg might be in the range of 0 to –0.2 volts or –0.1 to –0.4 volts. In general, any suitable voltage levels may be used, provided that Vcchg-high–Vsslg is greater than Vcc–Vss, where Vcc and Vss are the power supply voltages used for powering the core logic on the device. If desired, other power supply levels may be used for other circuitry. For example, a power supply level might be used to power input-output circuitry 12 that is larger than the power supply level used to power the core logic.

Lines 96 are used to distribute Vcchg-high and Vsslg to each of the memory elements 82 in memory element array 98. In the example of FIG. 4, there are three rows and three columns of memory elements 82 in array 98. This is merely illustrative. Integrated circuits such as integrated circuit 10 may have any suitable number of memory elements 82. A typical memory array might, as an example, have thousands or millions of memory elements 82 arranged in hundreds or thousands or rows and columns.

In the arrangement of FIG. 4, the signals Vcchg-high and Vsslg are constant. If desired, power regulator circuitry may generate the time-varying power supply signals to facilitate data loading operations. The use of constant values of Vcchg-high and Vsslg is described as an example.

Using a relatively low power supply level to power the core logic 18 provides benefits such as reduced power consumption. The power supply level used to power the memory elements 82 is larger than the core power supply level, but the loss in power consumption efficiency in array 98 that results from using an elevated power supply level in array 98 is offset by performance benefits.

Data loading and control circuitry 100 controls clearing and data loading operations for array 98. Data loading and control circuitry 100 receives configuration data from external sources via input path 102. In a typical system, configuration data is loaded into a programmable logic device from a memory and data loading circuit. This type of circuit, which is sometimes referred to as a configuration device, loads configuration data into registers 104. Address decoder 106 may receive external control signals via path 108 or addressing control signals can be generated internally in data loading and control circuitry 100.

Data loading and control circuitry 100 produces clear signals on clear line 111 (labeled CLR). Asserting the signal CLR with circuitry 100 clears the contents of the memory array 98. Clearing operations are generally performed upon system power-up or during reconfiguration. After the array has been cleared, the CLR signal is deasserted and the configuration data is loaded.

Configuration data may be loaded into registers 104 via paths 102 and 110. Registers 104 apply the configuration data in parallel to array 98 via the DATA_IN_1, DATA_IN_2, and DATA_IN_3 lines 112. Address decoder 106 receives addressing information via input 114 from an external source or from circuitry in data loading and control circuitry 100. The address decoder 106 systematically asserts and deasserts desired address lines 116 (i.e., ADD1, ADD2, or ADD3). As the address line in each column is asserted, the data on the data lines 112 is loaded into the memory elements 82 in that column. By addressing each column in this way, the entire array 98 is loaded with configuration data. After the array has been loaded, the output 118 of each memory element 82 produces a corresponding static control signal for controlling the gate of an NMOS transistor such as an NMOS pass transistor, a PMOS transistor such as a PMOS power-down transistor, or other logic component in the core logic 18 of the programmable logic device 10.

Figure 5:
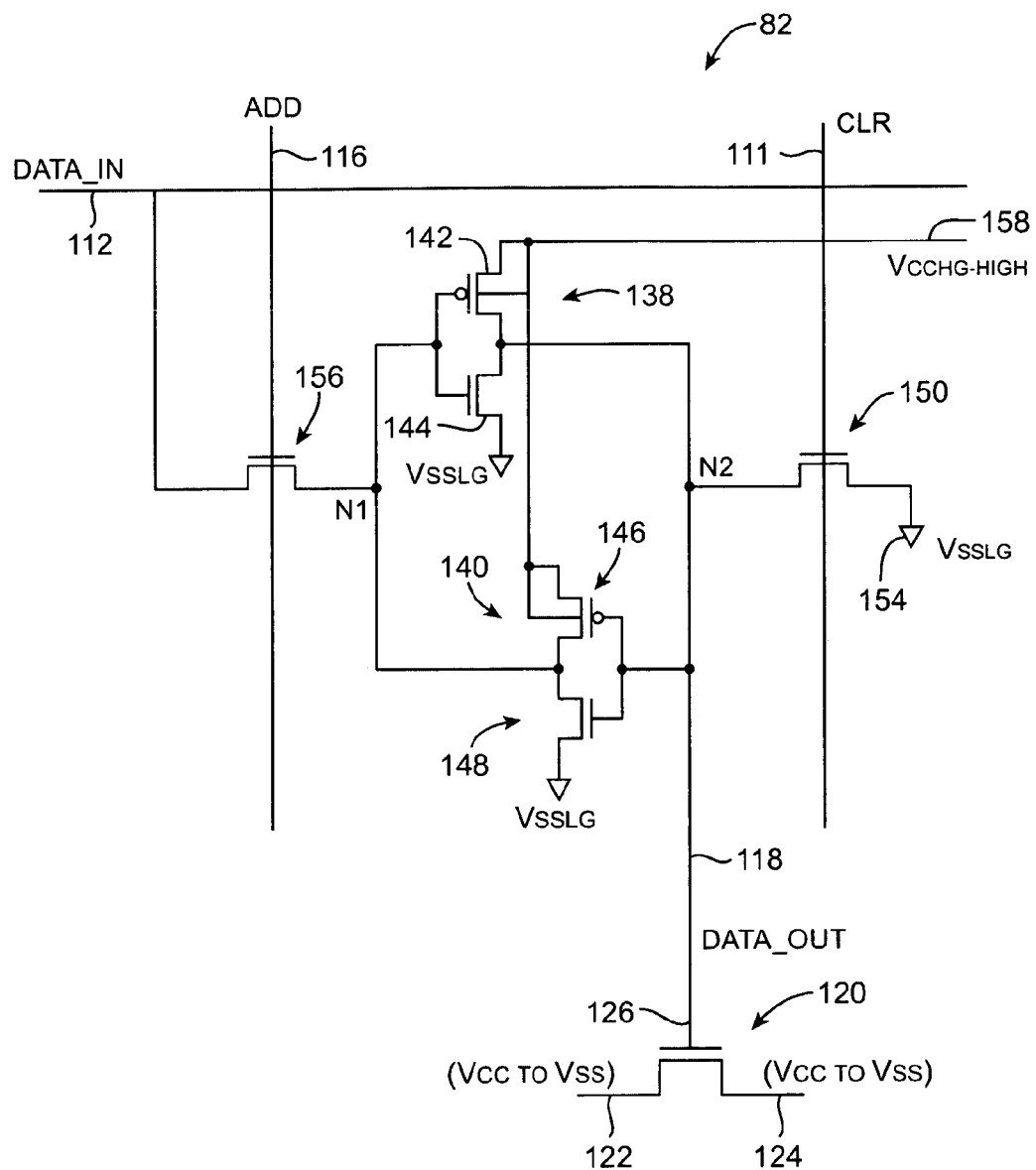
FIG. 5 is a diagram of an illustrative memory element controlling an n-channel metal-oxide-semiconductor pass transistor in an integrated circuit such as a programmable logic device integrated circuit of the type shown in FIG. 4 in accordance with the present invention.
Figure 6:
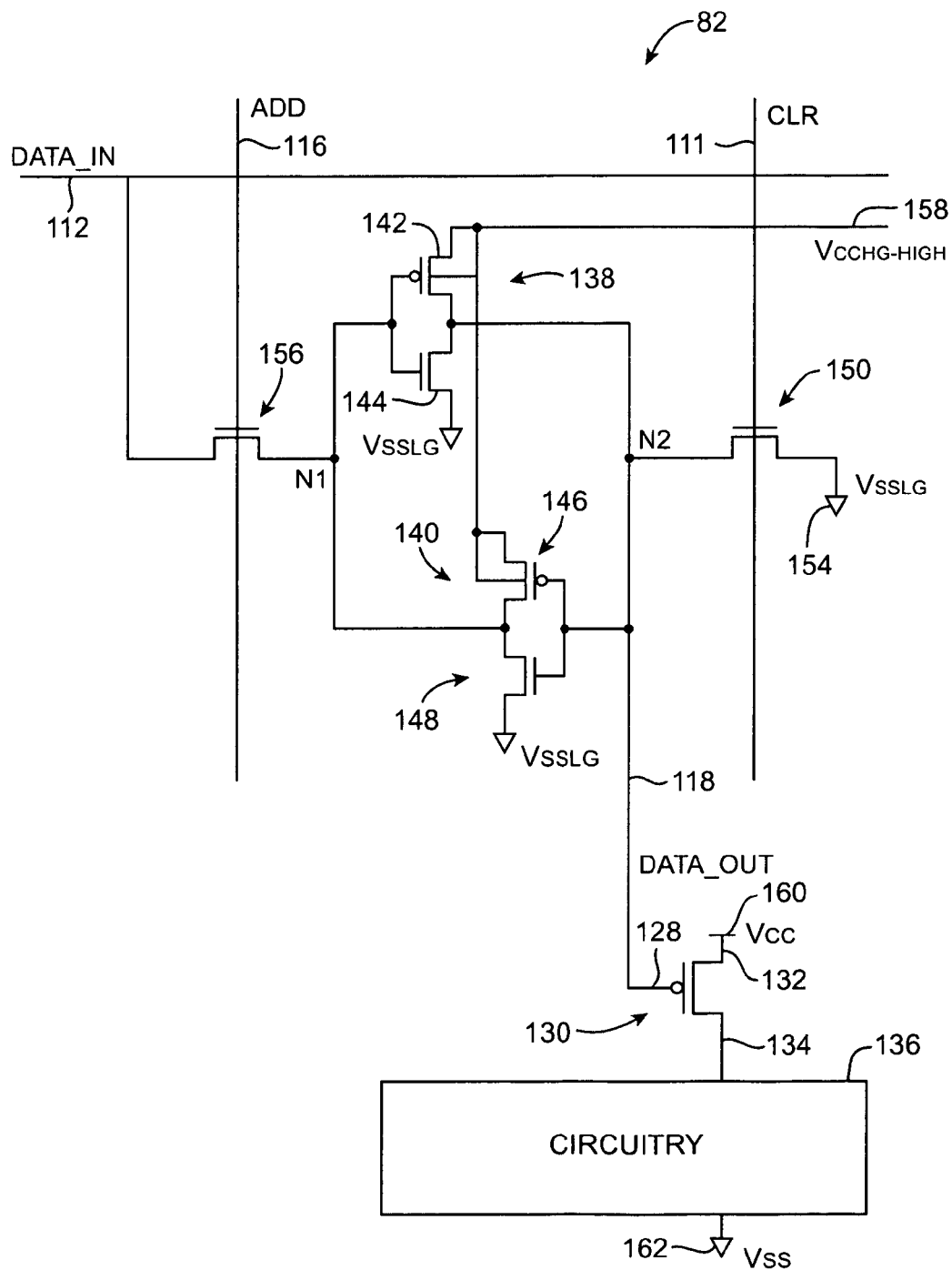
FIG. 6 is a diagram of an illustrative memory element controlling a p-channel metal-oxide-semiconductor power-down transistor in an integrated circuit such as a programmable logic device integrated circuit of the type shown in FIG. 4 in accordance with the present invention.

A memory element 82 of the type used in array 98 of FIG. 4 is shown in FIGS. 5 and 6.

In the example of FIG. 5, memory element 82 provides an output signal DATA_OUT on output 118 that controls an NMOS pass transistor 120. If DATA_OUT is high, the gate 126 of transistor 120 is high. This turns transistor 120 on, so that signals can pass from transistor input 122 to transistor output 124. If DATA_OUT is low, transistor 120 is off and signals are blocked.

In the example of FIG. 6, memory element 82 provides an output signal DATA_OUT on output line 118 that is applied to the gate 128 of PMOS transistor 130. When the DATA_OUT signal is a logic low, PMOS transistor 134 is turned on, so that positive power supply voltage Vcc on terminal 132 is allowed to pass to terminal 134 to power circuitry 136. When DATA_OUT is high, PMOS transistor 130 is turned off. Turning off transistor 130 blocks power supply voltage Vcc and thereby powers down the circuitry 136 to conserve power. Circuitry 136 is typically a region of core logic 18 on a programmable logic device that is unused and can therefore be powered down to reduce power consumption on the integrated circuit.

As shown in FIG. 5, memory element 82 is formed from two cross-coupled inverters—inverter 138 and inverter 140. Inverter 138 has a p-channel metal-oxide-semiconductor (PMOS) transistor 142 and an n-channel metal-oxide-semiconductor (NMOS) transistor 144. Inverter 140 has PMOS transistor 146 and NMOS transistor 148.

The NMOS clear transistor 150 is turned on during clear operations by activating clear line 111. This connects node N2 to ground 154 and clears the memory element 82. The output of the memory element on line 118 (DATA_OUT) is determined by the signal on node N2.

When address line 116 (signal ADD) is taken high, NMOS address transistor 156 is turned on and the signal on data line 112 is driven into the memory element 82. If the memory element 82 is cleared and the signal on line 112 is high, node N1 remains high when ADD is asserted and the memory element 82 remains in its low (cleared) state. In this situation, the voltage on node N2 is low and the output DATA_OUT is low (i.e., Vsslg) on line 130. If the memory element 82 is cleared and the signal on line 112 is low when ADD is asserted, node N1 is taken low. Inverter 138 inverts the low voltage on node N1, so that the voltage on node N2 and the signal DATA_OUT on line 118 is taken high.

The DATA_OUT signal is applied to the gate 126 of pass transistor 120 (in this example). Pass transistor 120 is contained in the core logic 18 of device 10. When DATA_OUT is low, pass transistor 120 is off. When DATA_OUT is high, pass transistor 120 is on and data is allowed to flow between line 122 and line 124.

Positive power supply voltage Vcchg-high is applied to the inverters via line 158. Ground voltage Vsslg is applied via ground 154. The terminals 158 and 154 of each memory element 82 in the array 98 are supplied with voltages Vcchg-high and Vsslg using lines 96 (FIG. 4).

In the illustrative memory cell arrangement of FIG. 6, the output signal DATA_OUT controls a power-down transistor 130. When DATA_OUT is high, transistor 130 is off, which prevents power from being supplied to circuitry 136. There may be any suitable number of power-down transistors such as transistor 130 on a given integrated circuit. When a portion of a programmable logic device is not needed (e.g., because that portion of circuitry is not being used to implement the logic designer's custom logic design), that portion of the device can be disabled by turning off its associated power-down transistor 130. Disabling unused circuitry in this way helps to reduce the amount of power consumed by the programmable logic device.

The memory cell 82 is preferably powered at an elevated power supply level. This improves the performance of transistors such as NMOS transistor 120 of FIG. 5 and PMOS transistor 130 of FIG. 6. The power supply level at which memory cell 82 is powered is represented by the difference between Vcchg-high and Vsslg. One or both of these values is preferably different than the values of Vcc and Vss that are used to power core logic 18 (FIG. 4). In particular, Vcchg-high is preferably larger than Vcc and Vsslg is preferably lower than Vss. With this type of arrangement, a DATA_OUT signal level of Vcchg-high is produced on line 118 when a logic one is stored in memory element 82. A DATA_OUT signal level of Vsslg is produced on line 118 when a logic zero is stored in memory element 82.

As shown in FIG. 5, the data signals passing through core logic transistor 120 have a voltage range of Vcc to Vss, because the core logic is powered using Vcc and Vss. Logic high signals have nominal voltages of Vcc. Logic low signals have nominal voltages of Vss. Optimally, these data signals are not degraded significantly when passing through transistor 120. This is ensured by using a value of Vcchg-high that is larger than Vcc. Using a value of Vcchg-high that is larger than Vcc helps to ensure that transistor 120 is turned fully on when DATA_OUT is high and lowers the resistance between terminal 122 and 124. As a result, the output logic signals on terminal 124 have appropriate logic levels (i.e., logic high signals have voltages of Vcc and logic low signals have voltages of Vss). This is particularly helpful on integrated circuits in which the value of Vcc has been lowered to reduce power consumption, because on such circuits it is difficult to properly turn on NMOS pass transistors using control signals of magnitude Vcc. Using a value of Vsslg that is lower than Vss helps to turn off transistor 120 fully, and reduce leakage, when DATA_OUT is low.

In the example of FIG. 6, the DATA_OUT signal on line 118 is applied to the gate of PMOS transistor 130.

When it is desired to power down core logic circuitry 136, a logic zero is stored in memory element 82. This causes memory element 82 to produce a DATA_OUT signal having a voltage of Vcchg-high on line 118. Because Vcchg-high is preferably larger than Vcc, transistor 130 will be fully turned off and leakage current will be reduced. If the larger value of Vcchg-high were not used to control transistor 130, transistor 130 could exhibit non-negligible leakage currents, which would give rise to undesirable power consumption by the powered-down circuitry 136.

When it is desired to use circuitry 136 to perform active circuit functions, a low DATA_OUT signal is produced on line 118, which turns transistor 130 on. Using a value of Vsslg that is less than Vss in this scenario helps to turn transistor 130 fully on. With transistor 130 fully on and less resistive, negligible voltage losses are incurred as power flows through transistor 130 from Vcc terminal 160 to circuitry 136 and Vss terminal 162.

Figure 7:
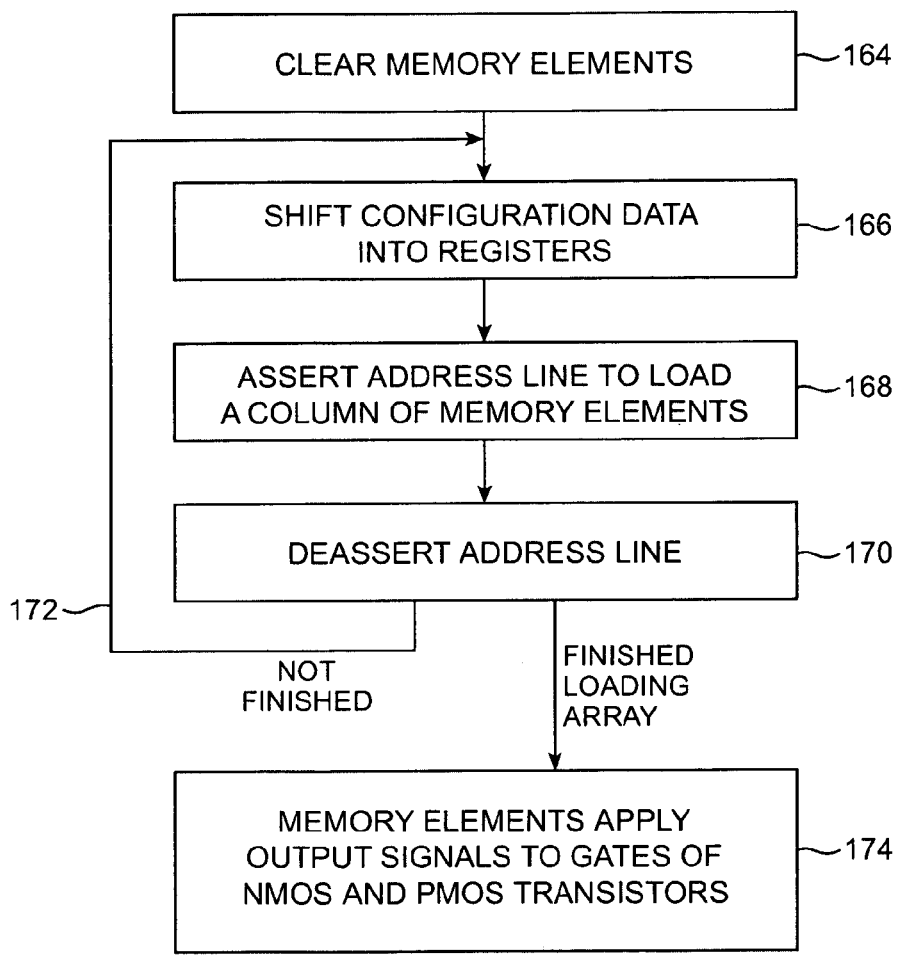
FIG. 7 is a flow chart of illustrative steps involved in operating memory element circuitry on an integrated circuit such as a programmable logic device integrated circuit in accordance with the present invention.

Illustrative steps involved in using memory elements 82 in an array 98 of memory elements on a programmable logic device integrated circuit 10 are shown in FIG. 7.

At step 164, the memory elements 82 are cleared using the clear line 111. The signal CLR may range from a low of Vsslg to a high of Vcchg-high, ensuring proper operation of clear transistor 150. During clearing operations, the clear signal CLR is asserted by taking CLR to Vcchg-high, which fully turns on transistor 150. When clearing is complete, the clear signal CLR is deasserted by taking CLR to Vsslg. Using a value of Vsslg as the logic low signal for the clear line prevents leakage currents from developing in transistor 150, which would develop if a higher voltage such as Vss were used.

At step 166, configuration data is shifted into registers 104 in data loading circuitry 100 via path 102 and input 110 (FIG. 4).

At step 168, control signals are applied to address decoder 106 of FIG. 4 at input 114. The control signals direct the address decoder 106 to assert a desired address line 116 to address a column of memory elements in array 98. The address signals ADD may range from a logic low value of Vsslg to a logic high value of Vcchg-high. Using a value of Vsslg for the logic low value of ADD prevents leakage currents from developing in unused (deasserted) address transistors 156. Using a value of Vcchg-high for the logic high value ensures that address transistors 156 can be fully turned on during addressing.

Asserting the address line by taking ADD to Vcchg-high loads the data that is present (in inverted form) on each DATA_IN line 112 into its associated memory element 82 in the addressed column of array 98. The data signals DATA_IN preferably have voltages ranging from a logic low level of Vsslg to a logic high level of Vcchg-high. This arrangement ensures that the data signals provided by registers 104 have voltages that match the voltages used in the memory array 98 to prevent contention.

At step 170, the address line is deasserted by taking ADD to Vsslg. If additional memory elements are to be loaded, processing returns to step 166 (line 172).

When all of the columns of array 98 have been loaded with data, the loaded memory elements may perform their intended functions in the programmable logic device integrated circuit 10 (step 174). During step 174, power regulator circuitry 84 uses an elevated power supply level to power the memory elements (i.e., using a positive power supply voltage of Vcchg-high and a ground power supply voltage of Vsslg). As a result, each memory element 82 that has been loaded with a logic one provides a logic high DATA_OUT output signal at a voltage of Vcchg-high and each memory element 82 that has been loaded with a logic zero provides a logic low DATA_OUT output signal at a voltage Vsslg.

The memory element output signals are provided to circuit components such as NMOS pass transistor 120 of FIG. 5 and PMOS power-down transistor 1130 of FIG. 6. Because the power supply level used to power each memory element 82 is elevated with respect to core logic supply levels Vcc and Vss that are used to power the core logic 18, transistors such as transistors 120 and 130 exhibit improved performance. For example, using a value of Vcchg-high that is larger than Vcc ensures that transistors 120 will be fully turned on and will not corrupt the core logic data signals passing from input 122 to output 124 (FIG. 5). Using a value of Vcchg-high that is higher than Vcc will also ensure that transistor 130 of FIG. 6 will be turned off completely and will therefore exhibit negligible leakage when powering down the circuitry 136 in the core logic.

Elevated power supply voltages can be provided by power regulator circuitry 84 using a number of suitable arrangements. With one suitable arrangement, a positive power supply voltage Vcchg-high that is larger than the core logic positive power supply voltage of Vcc is used while a ground (or "negative") power supply voltage of Vsslg that is less than the core logic ground power supply voltage Vss is used. If desired, the value of Vsslg may be equal to Vss or the value of Vcchg-high may be equal to Vcc. The threshold voltage Vt of the core logic transistors that are controlled by the outputs of the memory elements 82 may also be modified, in which case Vcchg-high may be lower than Vcc and Vsslg may be greater than Vss.

Figure 8:
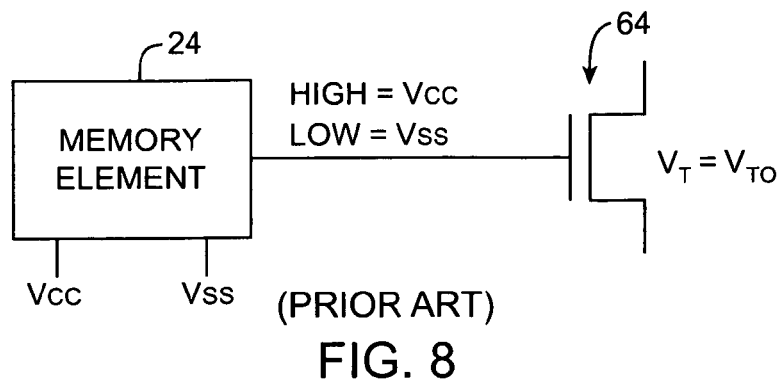
FIG. 8 is a diagram of a conventional memory element controlling a transistor in an integrated circuit.

A conventional memory element and core logic transistor arrangement is shown in FIG. 8. As shown in FIG. 8, the output of memory element 24 is applied to the gate of transistor 64 to turn transistor 64 on or off as desired. Transistor 64 is a metal-oxide-semiconductor transistor, so transistor 64 has an associated threshold voltage Vt. In the example of FIG. 8, the transistor 64 has a threshold voltage Vt equal to Vto.

Figure 9:
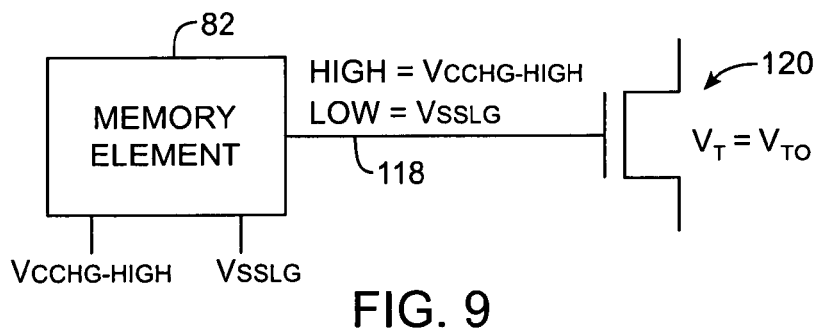
FIG. 9 is a diagram of a memory element controlling a transistor in an integrated circuit in accordance with the present invention.

A memory element 82 in accordance with the present invention is shown in FIG. 9. Memory element 82 is powered using an elevated power supply level, so its output ranges from a low value of Vsslg to a high value of Vcchg-high. The performance of transistor 120 is improved due to the use of the elevated power supply. For example, a transistor 120 that has the same threshold voltage (Vto) as the transistor 64 of FIG. 8 will be turned on more fully than would be possible using the conventional arrangement of FIG. 8. As a result, signals will not be degraded as they pass through transistor 120, even on integrated circuits that use low values of Vcc in their core logic.

Figure 10:
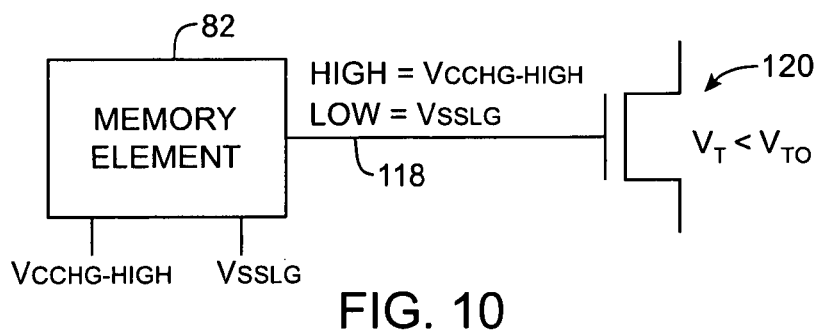
FIG. 10 is a diagram of a memory element controlling a transistor with a reduced threshold voltage in an integrated circuit in accordance with the present invention.
Figure 11:
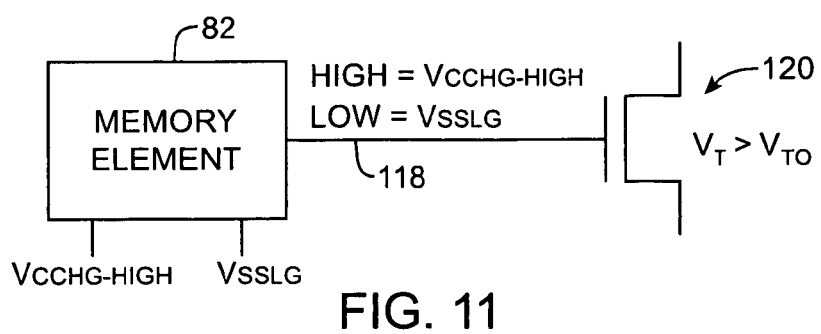
FIG. 11 is a diagram of a memory element controlling a transistor with an elevated threshold voltage in an integrated circuit in accordance with the present invention.

If desired, the threshold voltage of core logic transistors such as transistor 120 may be modified. In the example of FIG. 10, the transistor 120 has a threshold voltage Vt that is less than Vto. In the example of FIG. 11, the transistor 120 has a threshold voltage Vt that is greater than Vto. These types of arrangement will still exhibit improved performance relative to the conventional arrangement of FIG. 8, provided that the values of Vcchg and Vsslg are chosen properly.

Consider, as an example, the situation in which the threshold voltage Vt is lowered, as shown in FIG. 10. In this type of situation, it is desirable to lower Vsslg relative to Vss. Failure to lower Vsslg while decreasing the threshold voltage Vt will tend to increase transistor leakage current. Proper selection of a lowered value of Vsslg to avoid increased leakage and the use of an increased value of Vcchg-high to improve the turn-on characteristics of transistor 120 will produce an arrangement with improved performance.

As another example, consider the situation in which the threshold voltage Vt is raised, as shown in FIG. 11. If the threshold voltage of the transistor is raised, care should be taken to raise Vcchg-high. If Vt is raised above Vto, but Vcchg-high is not raised above Vcc, the transistor 120 will exhibit reduced turn-on performance relative to a comparable conventional transistor.

Depending on the extent of the threshold voltage changes that are made to the core logic transistors being controlled by the memory elements, it may be possible to elevate the memory element power supply level while reducing Vcchg or raising Vsslg.

As an example, consider a prior art arrangement of the type shown in FIG. 8. The values of Vcc, Vss, and Vto might be 1.2 volts, 0 volts, and 0.3 volts.

One way to improve performance on an integrated circuit using core logic power supply voltages Vcc and Vss of 1.2 volts and 0 volts, respectively, is to elevate the power supply level relative to the core logic by using a boosted value of positive power supply voltage such as a Vcchg-high value of 1.4 volts, by using a reduced value of ground voltage such as a Vsslg value of −0.2 volts, and by fabricating transistors such as transistor 120 so that their threshold voltages Vt are unchanged at 0.3 volts. In this situation, the Vcchg-high value of 1.4 volts will turn on an NMOS transistor 120 more fully than the 1.2 volt positive power supply voltage Vcc in the conventional arrangement, while the Vsslg value of −0.2 volts will reduce NMOS transistor leakage. PMOS transistor performance will also be enhanced by the elevated power supply level as described in connection with FIG. 6. NMOS transistor performance is discussed in connection with FIGS. 8-11 as an example.

An equivalent way to improve performance on the same type of integrated circuit is to fabricate the transistors 120 so that their threshold voltage is 0 volts (i.e., lower the threshold voltage of transistor 120 relative to transistor 64 of FIG. 8 by 0.3 volts), while using a positive power supply voltage Vcchg-high of 1.1 volts and ground voltage Vsslg of −0.5 volts. In this situation, the power supply level for the memory elements is 1.6 volts (Vcchg-high−Vsslg) and has been elevated with respect to the core logic supply, which has a level of 1.2 volts (Vcc−Vss). Vsslg has been reduced more than Vt has been reduced, because Vsslg has been reduced by 0.5 volts relative to Vss, whereas Vt has been reduced by 0.3 volts relative to Vto. As a result, the leakage current of the transistor 120 will be improved. Vcchg-high has been reduced rather than raised, but the reduction of Vcchg-high relative to Vcc (0.1 volts) is less than the reduction of Vt (which was reduced by 0.3 volts relative to Vto). Accordingly, the turn-on performance of transistor 120 will be improved.

As these examples demonstrate, optimization of the performance of a memory element 82 preferably takes into account the characteristics of the transistors being controlled by the memory element's output. If the threshold voltages of the transistors being controlled by the memory elements are modified, comparable modifications can be made to the voltages Vcchg-high and Vsslg to ensure that transistor performance is enhanced due to the use of the elevated memory element power supply level. If the threshold voltages of the NMOS and PMOS transistors are modified, performance enhancements may be obtained by elevating the memory element power supply level with respect to the core logic power supply level even if Vcchg-high is lower than or equal to Vcc or if Vsslg is greater than or equal to Vss.

The foregoing is merely illustrative of the principles of this invention and various modifications can be made by those skilled in the art without departing from the scope and spirit of the invention.

What is claimed is:

1. A programmable logic device integrated circuit comprising:

a region of programmable core logic including transistors, wherein the core logic is powered at a core logic power supply level; and an array of volatile memory elements powered with a memory element power supply level that is greater than the core logic power supply level, wherein the memory elements are loaded with configuration data and provide corresponding output signals that are applied to respective gates of the transistors, wherein the transistors comprise p-channel metal-oxide-semiconductor power-down transistors, some of which are selectively turned off to power down portions of circuitry on the integrated circuit.

2. The programmable logic device integrated circuit defined in claim 1 further comprising first and second memory element power supply terminals in each memory element, wherein the core logic power supply level is provided using a core logic positive power supply voltage and a core logic ground and wherein the memory element power supply level is provided to each memory element using a memory element positive power supply voltage applied to the first memory element power supply terminal and a memory element ground applied to the second memory element power supply terminal, and wherein when the output signals are being provided to the respective gates of the transistors, the memory elements are being powered using a memory element positive power supply voltage that is greater than the core logic positive power supply voltage.

3. The programmable logic device integrated circuit defined in claim 1 further comprising first and second memory element power supply terminals in each memory element, wherein the core logic power supply level is provided using a core logic positive power supply voltage and a core logic ground and wherein the memory element power supply level is provided to each memory element using a memory element positive power supply voltage applied to the first memory element power supply terminal and a memory element ground applied to the second memory element power supply terminal, and wherein when the output signals are being provided to the respective gates of the transistors, the memory elements are being powered using a memory element ground power supply voltage that is less than the core logic ground power supply voltage.

4. The programmable logic device integrated circuit defined in claim 1 further comprising first and second memory element power supply terminals in each memory element, wherein the core logic power supply level is provided using a core logic positive power supply voltage and a core logic ground and wherein the memory element power supply level is provided to each memory element using a memory element positive power supply voltage applied to the first memory element power supply terminal and a memory element ground applied to the second memory element power supply terminal, and wherein when the output signals are being provided to the respective gates of the transistors, the memory elements are being powered using a memory element positive power supply voltage that is greater than the core logic positive power supply voltage and using a memory element ground power supply voltage that is less than the core logic ground power supply voltage.

5. The integrated circuit defined in claim 1 wherein each memory element comprises two cross-coupled inverters, wherein each inverter comprises a p-channel metal-oxide-semiconductor transistor and an n-channel metal-oxide-semiconductor transistor, wherein the p-channel metal-oxide-semiconductor transistor and an n-channel metal-oxide-semiconductor transistor in each inverter are connected in series between a positive power supply terminal at which the memory element positive power supply voltage is supplied and a ground terminal at which the memory element ground power supply voltage is supplied, wherein the core logic power supply level is provided using a core logic positive power supply voltage and a core logic ground and wherein the memory element power supply level is provided using a memory element positive power supply voltage and a memory element ground, and wherein when the output signals are being provided to the respective gates of the transistors, the memory elements are being powered using a memory element positive power supply voltage that is greater than the core logic positive power supply voltage.

6. The integrated circuit defined in claim 1 wherein each memory element comprises two cross-coupled inverters, wherein each inverter comprises a p-channel metal-oxide-semiconductor transistor and an n-channel metal-oxide-semiconductor transistor, wherein the p-channel metal-oxide-semiconductor transistor and an n-channel metal-oxide-semiconductor transistor in each inverter are connected in series between a positive power supply terminal at which the memory element positive power supply voltage is supplied and a ground terminal at which the memory element ground power supply voltage is supplied, wherein the core logic power supply level is provided using a core logic positive power supply voltage and a core logic ground and wherein the memory element power supply level is provided using a memory element positive power supply voltage and a memory element ground, and wherein when the output signals are being provided to the respective gates of the transistors, the memory elements are being powered using a memory element ground power supply voltage that is less than the core logic ground power supply voltage.

7. The integrated circuit defined in claim 1 wherein each memory element comprises two cross-coupled inverters, wherein each inverter comprises a p-channel metal-oxide-semiconductor transistor and an n-channel metal-oxide-semiconductor transistor, wherein the p-channel metal-oxide-semiconductor transistor and an n-channel metal-oxide-semiconductor transistor in each inverter are connected in series between a positive power supply terminal at which the memory element positive power supply voltage is supplied and a ground terminal at which the memory element ground power supply voltage is supplied, wherein the core logic power supply level is provided using a core logic positive power supply voltage and a core logic ground and wherein the memory element power supply level is provided using a memory element positive power supply voltage and a memory element ground, and wherein when the output signals are being provided to the respective gates of the transistors, the memory elements are being powered using a memory element positive power supply voltage that is greater than the core logic positive power supply voltage and using a memory element ground power supply voltage that is less than the core logic ground power supply voltage.

8. The integrated circuit defined in claim 1, wherein the transistors comprise n-channel metal-oxide-semiconductor pass transistors.

9. A programmable logic device integrated circuit comprising:
a region of programmable core logic including transistors, wherein the core logic is powered at a core logic power supply level; and
an array of volatile memory elements powered with a memory element power supply level that is greater than the core logic power supply level, wherein the memory elements are loaded with configuration data and provide corresponding output signals that are applied to respective gates of the transistors, wherein the core logic power supply level is provided using a core logic positive power supply voltage and a core logic ground and wherein the memory element power supply level is provided using a memory element positive power supply voltage and a memory element ground, wherein when the output signals are being provided to the respective gates of the transistors, the memory elements are being powered using a memory element positive power supply voltage that is greater than the core logic positive power supply voltage and using a memory element ground power supply voltage that is less than the core logic ground power supply voltage, wherein each memory element comprises an address transistor controlled by an address line with associated address signals, and wherein the associated address signals have logic high levels equal to the memory element positive power supply voltage and logic low levels equal to the memory element ground power supply voltage.

10. The integrated circuit defined in claim 9, wherein each memory element is connected by its address transistor to a data line with associated data signals.

11. The integrated circuit defined in claim 9, wherein each memory element comprises a clear transistor controlled by a clear line with associated clear signals, and wherein the associated clear signals have logic high levels equal to the memory element positive power supply voltage and logic low levels equal to the memory element ground power supply voltage.

12. The integrated circuit defined in claim 9, wherein each memory element comprises a clear transistor controlled by a clear line with associated clear signals, wherein the associated clear signals have logic high levels equal to the memory element positive power supply voltage and logic low levels equal to the memory element ground power supply voltage, wherein each memory element is connected by its address transistor to a data line with associated data signals, and wherein the associated data signals have logic high levels equal to the memory element positive power supply voltage and logic low levels equal to the memory element ground power supply voltage.

13. A programmable logic device integrated circuit comprising:
a region of programmable core logic including transistors, wherein the core logic is powered at a core logic power supply level; and
an array of volatile memory elements powered with a memory element power supply level that is greater than the core logic power supply level, wherein the memory elements are loaded with configuration data and provide corresponding output signals that are applied to respective gates of the transistors, wherein the core logic power supply level is provided using a core logic positive power supply voltage and a core logic ground and wherein the memory element power supply level is provided using a memory element positive power supply voltage and a memory element ground, wherein when the output signals are being provided to the respective gates of the transistors, the memory elements are being powered using a memory element positive power supply voltage that is greater than the core logic positive power supply voltage and using a memory element ground power supply voltage that is less than the core logic ground power supply voltage, wherein each memory element comprises a clear transistor controlled by a clear line with associated clear signals, and wherein the associated clear signals have logic high levels equal to the memory element positive power supply voltage and logic low levels equal to the memory element ground power supply voltage.

14. A method for using volatile memory elements on a programmable logic device integrated circuit that contains programmable core logic, comprising:
powering the programmable core logic at a core power supply level;
powering the volatile memory elements with a memory element power supply level that is elevated with respect to the core power supply level, wherein powering the programmable core logic with the core power supply level comprises powering the programmable core logic using a core logic positive power supply voltage and a core logic ground power supply voltage, wherein powering the memory elements with the memory element power supply level comprises powering the memory elements using a memory element positive power supply voltage and a memory element ground power supply voltage, wherein the memory element positive power supply voltage is greater than the core logic positive power supply voltage, wherein the memory element ground power supply voltage is less than the core logic ground power supply voltage, and wherein each memory element has an n-channel metal-oxide-semiconductor address transistor controlled by an address line; and
asserting and deasserting the address line to load data into the memory elements, wherein asserting the address line comprises raising the address line to the memory element positive power supply voltage and wherein deasserting the address line comprises lowering the address line to the memory element ground power supply voltage.

15. The method defined in claim 14 further comprising:
asserting and deasserting a clear line to clear the memory elements before data loading, wherein asserting the clear line comprises raising the clear line to the memory element positive power supply voltage and wherein deasserting the clear line comprises lowering the clear line to the memory element ground power supply voltage.

* * * * *